(12) United States Patent
Mulbrook

(10) Patent No.: US 7,023,249 B1
(45) Date of Patent: Apr. 4, 2006

(54) PHASE LOCKED LOOP WITH LOW PHASE NOISE AND FAST TUNE TIME

(75) Inventor: Mark M. Mulbrook, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 10/893,287

(22) Filed: Jul. 16, 2004

(51) Int. Cl.
*H03L 7/06* (2006.01)
(52) U.S. Cl. .......... 327/156; 331/17; 375/376
(58) Field of Classification Search ........ 327/147–148, 327/156–157; 375/373–376; 331/17, 16, 331/1 A, 8, DIG. 2, 25
See application file for complete search history.

(56) References Cited

U.S. PATENT DOCUMENTS

| | | | | |
|---|---|---|---|---|
| 4,055,814 A | * | 10/1977 | Abraham et al. | 331/1 A |
| 4,752,749 A | | 6/1988 | Moger | 331/17 |
| 5,121,085 A | * | 6/1992 | Brown | 331/8 |
| 5,150,372 A | * | 9/1992 | Nourrcier | 372/38.04 |
| 5,315,623 A | * | 5/1994 | Kuo | 375/376 |
| 5,663,685 A | * | 9/1997 | Kesner | 331/1 A |
| 5,675,291 A | | 10/1997 | Sudjian | 331/17 |
| 5,774,023 A | | 6/1998 | Irwin | 331/17 |
| 6,064,273 A | * | 5/2000 | Donohue | 331/17 |
| 6,611,176 B1 | * | 8/2003 | Goldman | 331/17 |

* cited by examiner

*Primary Examiner*—Minh Nguyen
(74) *Attorney, Agent, or Firm*—Nathan O. Jensen; Kyle Eppele

(57) ABSTRACT

A phase locked loop with fast tune time and low phase noise contains a fast filter and a slow filter connected to a phase detector. The slow filter filters an error signal with a narrow bandwidth and provides a slow filter tune voltage. An integrator is connected to the slow filter for integrating the slow filter tune voltage and providing a tune voltage to a VCO. The integrator has a capacitor and operational amplifier. The fast filter filters and amplifies the error signal with a wide bandwidth and high gain to provide a fast filter tune voltage. A diode is connected to the fast filter output and to a non-inverting input of the operational amplifier. The diode is forward biased when the fast filter tune voltage is sufficient thereby causing an inverting input of the operational amplifier to change to the same level to rapidly change capacitor charge.

13 Claims, 4 Drawing Sheets

PHASE LOCKED LOOP WITH LOW PHASE NOISE AND FAST TUNE TIME

BACKGROUND OF THE INVENTION

This invention relates to radio communications systems, frequency synthesizers, and specifically improving tune time and reducing phase noise in a phase locked loop that may be used in a frequency synthesizer.

Phase locked loops are commonly used to provide a precise, stable frequency. A phase locked loop (PLL) can be used in a frequency synthesizer as a local oscillator in a receiver and in a transmitter to generate an output signal having a selectively variable frequency. The basic elements of a phase locked loop include a voltage controlled oscillator (VCO) for producing an output signal with a controlled frequency, a phase detector for comparing the phase of the output signal with that of a predetermined reference signal and for producing an error signal representing the detected phase difference, and a loop filter for filtering the error signal and coupling it to the VCO to controllably adjust the output signal frequency.

A design tradeoff for loop bandwidth exists between tune time and phase noise in a phase locked loop. In applications such as frequency hopping transmitters and receivers, the frequency of a PLL frequency synthesizer must be changed quickly. For fast frequency changes, it is desirable that the PLL loop filter have a wide bandwidth. With the large number of noise contributors in a PLL this wide bandwidth results in poor noise performance. There is an optimum bandwidth for noise performance, which is often a smaller bandwidth than what is required for tune time. Once a new frequency is attained and the PLL is locked it is desirable to have a narrow loop filter bandwidth to reduce phase noise that affects transmitter and receiver performance.

To achieve the tune time and noise performance in many systems today, two separate PLLs are required. Only one PLL is used at time, the other is tuning during the dwell time. This is commonly referred to as a ping-pong solution. This solution allows the loop bandwidth to be designed for optimum noise performance and poor tune time performance since the dwell times are typically much longer than the tune time requirements. The hardware has to switch between the two loops to achieve the desired tune time. This solution ha a hardware impact of doubling the circuitry required to achieve the desired performance.

Another approach using two separate bandwidths is to switch between a wide bandwidth fast filter for fast tuning and a narrow bandwidth slow filter for operation with low phase noise. However switching introduces voltage transients that render the VCO output unstable for a length of time and the output is thus not usable until the VCO frequency stabilizes. The transients usually result from an inability to maintain a constant DC voltage level on a capacitor in the loop filter/integrator in both wideband and narrowband modes. The settling time may be too long for use in a frequency hopping system.

Another design to reduce tune time and phase noise has utilized a phase locked loop that has the capability to change loop bandwidth as the error frequency becomes small. There are limitations with this approach. The gain bandwidth is changed but the phase response of the loop remains unchanged. This limits the range over which the gain bandwidth of the loop can be changed.

What is needed is an approach for reducing phase locked loop tuning time and phase noise that offers fast tuning adequate for frequency hopping applications while meeting phase noise requirements.

SUMMARY OF THE INVENTION

A phase locked loop with low phase noise and fast tune time is disclosed. The phase locked loop comprises a voltage controller oscillator (VCO) for providing an output signal controlled by a tune voltage. A divider is connected to the VCO for dividing the output signal from the VCO. A reference oscillator generates a reference signal. A phase detector is connected to the divider and the reference oscillator for comparing the reference signal to the divided VCO signal and generating an error signal indicating a lock condition of the phase locked loop. A fast filter has an input connected to the phase detector and has a wide bandwidth for filtering the phase detector error signal. The fast filter provides a fast filter tune voltage when the phase locked loop is tuning. A slow filter has an input connected to the phase detector and the fast filter and has a narrow bandwidth for filtering the phase detector output. The slow filter provides a slow filter tune voltage. An integrator connected to the slow filter and the fast filter has an integrator capacitor that has its charge rapidly charged by the fast filter tune voltage to quickly tune the phased locked loop. The slow filter tune voltage tunes the VCO when the phase locked loop is locked.

The integrator further comprises an integrator operation amplifier having a non-inverting input connected to the fast filter through a diode. The fast filter tune voltage changes a bias on the non-inverting input of the integrator operational amplifier thereby changing a bias on an inverting input when the phase lock loop is tuning to rapidly change a charge on the integrator capacitor to reduce the tune time. The fast filter tune voltage stops changing the bias on the non-inverting input of the integrator operational amplifier when the phase locked loop is locked on a new frequency. The fast filter has a gain greater than the slow filter thereby enabling the fast filter tune voltage to change the bias on the non-inverting input when the phase locked loop is tuning. The fast filter tune voltage may rise to near an operational amplifier supply voltage when the phase locked loop is tuning. The fast filter tune voltage is near the supply voltage when the phase detector output voltage is at a high maximum DC level.

It is an object of the present invention to provide a circuit that enables fast tuning of a phase locked loop.

It is an object of the present invention to provide a circuit that enables low phase noise performance in a phase locked loop.

It is an advantage of the present invention to reduce tune time and phase noise with a small number or components.

It is an advantage of the present invention to greatly increase loop gain in a phase locked loop.

It is a feature of the present invention to eliminate dual loop synthesizer designs.

BRIEF DESCRIPTION OF THE DRAWINGS

The invention may be more fully understood by reading the following description of the preferred embodiments of the invention in conjunction with the appended drawings wherein.

DETAILED DESCRIPTION

A phase locked loop with a fast tune time and low phase noise is disclosed that overcomes limitations of other approaches by using a novel integrator capacitor fast charging approach.

Figure 1:
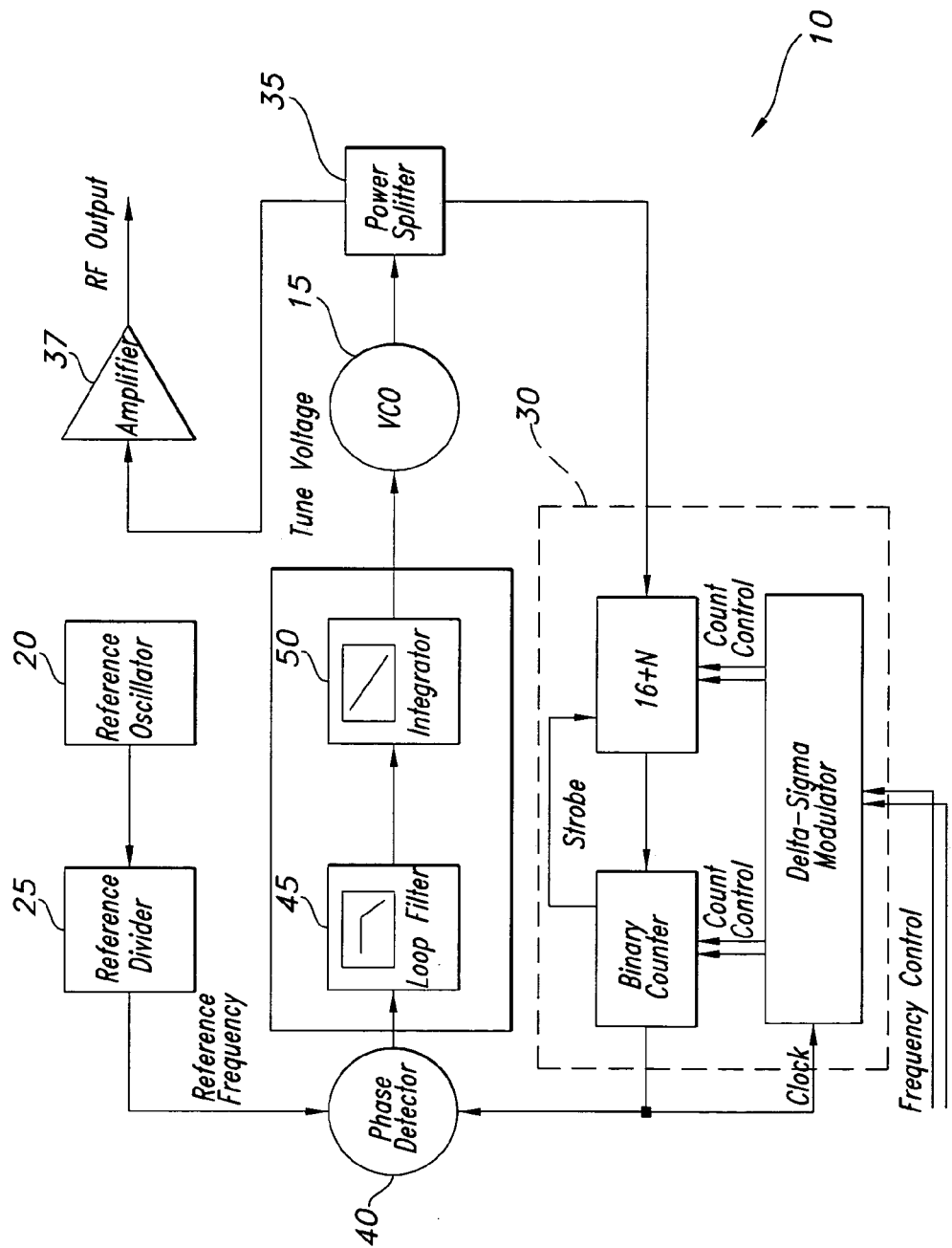
FIG. 1 is a block diagram frequency synthesizer in which the present invention may be used.

FIG. 1 is block diagram of a phase locked loop (PLL) synthesizer 10. The PLL synthesizer 10 includes a VCO 15 operating under the control of a reference oscillator 20 through an optional reference divider 25 and a feedback signal from the VCO 15 output through a divider 30. The divider 30 may be an integer divider or a modulated fractional divider (MFD) depending on phase locked loop design requirements. An MFD 30 is shown in FIG. 1. Frequency control of the PLL synthesizer 10 is accomplished by dividing an output frequency of the VCO 15 by a divisor within the divider 30. A phase difference between an output of the divider 30 and reference oscillator 20 or reference divider 25 is detected within a phase detector 40, low-pass filtered in a loop filter 45 and integrated in integrator 50 and applied as a tune voltage to the VCO 15. A power splitter 35 may be used to split the VCO 15 output to provide the feedback signal to the divider 30 and the VCO 15 output to an optional amplifier 37 for use within a receiver and/or transmitter (not shown) or some other application.

The loop filter 45 and integrator 50 filter the output of the phase detector 40 to provide the tune voltage to the VCO 15. The bandwidth of the loop filter 45 must be narrow to reduce the phase noise of the PLL 10 output signal to a required level. As the loop filter 45 bandwidth decreases, the time for the synthesizer 10 to change frequencies increases. Various methods previously described have been used to reduce tuning time while maintaining a narrow bandwidth to reduce phase noise.

Figure 2:
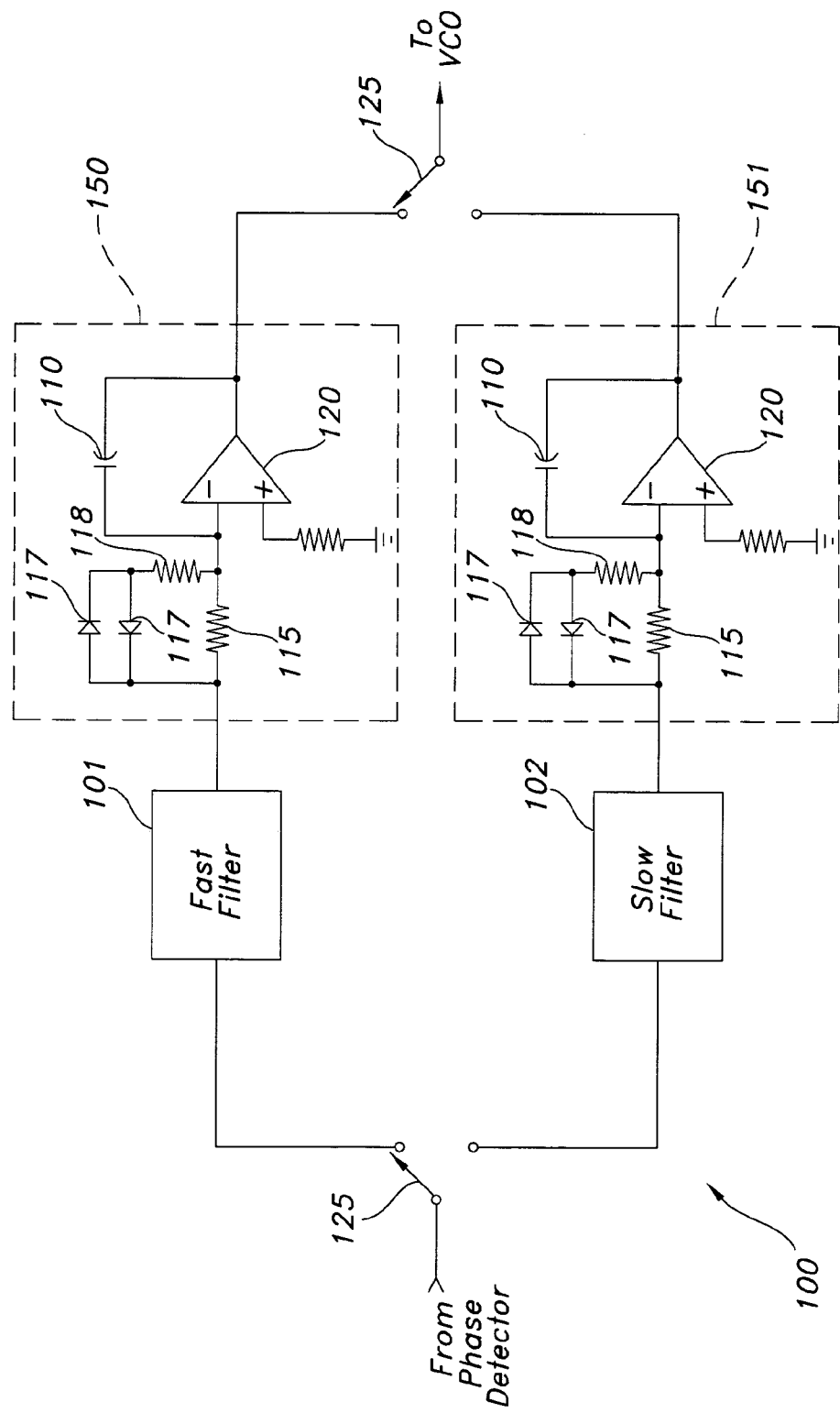
FIG. 2 is a block diagram of a dual filter/integrator approach that may be used to reduce tune time and phase noise in a phase locked loop.

FIG. 2 is a block diagram of a dual filter/integrator 100 approach that may be used to reduce tune time and phase noise in a phase locked loop. The dual filter/integrator 100 is used in place of the loop filter 45 and integrator 50 in FIG. 1. A wide bandwidth fast filter 101 along with an integrator 150 make up a fast loop. A narrow bandwidth slow filter 102 and integrator 151 comprise a slow loop. The fast loop and slow loop are switched with switches 125 at the input and output. The fast loop is switched in when the synthesizer 10 is tuning and when tuned the slow loop is switched in. Diodes 117 are used to rapidly pre-charge integrator capacitors 110 through integrator resistors 118. When the input voltage from the phase detector 40 is sufficient to forward bias one of the diodes 117 the DC level is raised or lowered at the inverting (−) input of integrator operational amplifiers 120 while effectively shorting integrator resistors 115. This pre-charging of the integrator capacitors 110 helps to reduce tuning time since integrator resistor 118 is smaller than integrator resistor 115.

Rapid charging of the integrator capacitor 110 is limited in the circuit shown in FIG. 2 due to a limited output voltage level from the phase detector 40, typically one volt as an example. Furthermore the size of integrator resistor 118 limits integrator capacitor 110 charge time. Integrator resistor 118 cannot be reduced below a certain limit to maintain a needed loop bandwidth for loop stability. Switch 125 operation can cause fluctuations in the voltage applied to the VCO 15 with the circuit in FIG. 2. The diodes 117 allow the loop gain to change without changing loop phase response. This limits the amount of loop gain change that can be achieved. Furthermore the circuit shown in FIG. 2 requires twice the number of components and only one condition of tune time vs. noise performance can be addressed.

U.S. Pat. No. 4,752,749, incorporated by reference and assigned to the assignee of the present invention, discloses a fast response phase locked loop that provides the wide bandwidth for fast tuning and a narrow bandwidth for low phase noise. Frequency disturbances caused by voltage fluctuations that occur when a bandwidth limiting lag network is switched in and out of a frequency synthesizer circuit to provide the wide bandwidth necessary for fast frequency hopping are eliminated by the disclosed invention. Rather than switching a parallel charging source for a large network capacitor out of the circuit during each hopping interval, the capacitor is charged in series to a constant level during a narrow bandwidth mode and charged on both plates in consonance with an input voltage during a wide bandwidth mode to thereby render the lag network active during the narrowband mode and transparent during the wideband mode.

Figure 3:
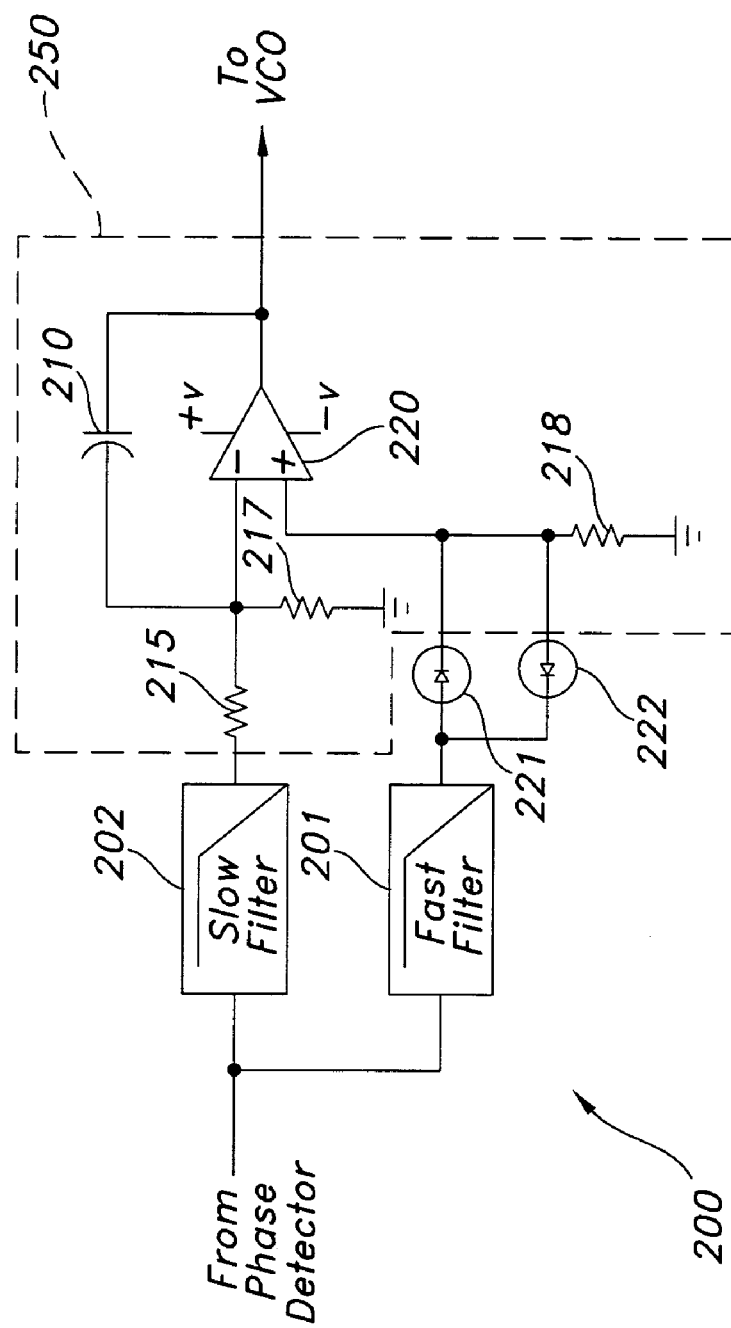
FIG. 3 is diagram of a dual filter single integrator for reducing phase locked loop tune time and phase noise of the present invention.

The present invention shown in FIG. 3 is for a dual filter single integrator circuit 200 for rapidly changing a charge on an integrator capacitor 210 within an integrator 250 to reduce tune time and then providing a narrow bandwidth needed for low phase noise. The present invention shown in FIG. 3 may be used in the frequency synthesizer 10 of FIG. 1 to perform the loop filter 45 and integrator 50 functions. The integrator 250 comprises the integrator capacitor 210 connected to an inverting input (−) and to an output of an integrator operational amplifier 220. An integrator resistor 215 is connected to the inverting input and the integrator capacitor 210. Optional resistor 217 is also connected to the inverting input of operational amplifier 220. Bias resistor 218 is connected to a non-inverting input (+) of operational amplifier 220. The integrator capacitor 210 is typically large to integrate the slow filter 202 tune voltage output to achieve a desired phase locked loop phase noise characteristic. The tune time of the synthesizer 10 can be reduced by rapidly changing the charge on the integrator capacitor 210.

With the present invention the charging current to the integrator capacitor 210 is increased by placing a large input voltage swing into the integrator 250. The tune time of synthesizer 10 is further increased by incorporating a fast filter 201 with a wide bandwidth and a slow filter 202 with a narrower bandwidth. The fast filter 201 may have a low pass or bandpass characteristic. The fast filter 201 has a greater gain and a different phase response than the slow filter 202. The slow filter 202 input is connected to the phase detector 40 output and its output to the integrator 250 to the integrator resistor 215. The fast filter 201 input is also connected to the phase detector 40 output and the slow filter 202 input. The output of the fast filter 201 is connected to diode 221 anode and to diode 222 cathode. Diode 221 cathode and diode 222 anode are connected to the non-inverting input of integrator operational amplifier 220 and bias resistor 218.

The charge on the integrator capacitor 210 is increased or decreased by increasing or decreasing the voltage at the integrator capacitor 210 connected to the inverting input of integrator operational amplifier 220. The charge on integrator capacitor is increased or decreased depending on which way the synthesizer 10 needs to tune to reach a desired new frequency. A voltage on the inverting input of the integrator operational amplifier 220 increases or decreases to equal a voltage applied to the non-inverting input of the operational amplifier 220 from the fast filter 201 through diode 221 or 222.

The fast filter 201 provides a fast filter tune voltage that contains the filtered and amplified phase detector 40 output signals. Phase detector 40 may be a phase frequency detector (PFD) known in the art. The PFD 40 generates the error signal in the phase locked loop by comparing the reference 20 signal with the divided VCO 15 signal. The PFD 40 operates in three modes comprising frequency detect, phase detect, and phase locked mode. The PFD 40 is in the frequency detect mode when the phase difference between the reference signal and the divided VCO signal is greater than ±2π. The output of the PFD 40 in the frequency detect mode is a high or low maximum DC level depending on which input signal is higher in frequency. In the frequency detect mode, the fast filter 201 filters and amplifies the PFD 40 output providing the fast filter tune voltage DC output to diodes 221 and 222. Either diode 221 or 222 is forward biased depending on the output voltage from the fast filter 201 that is in turn dependent on which PFD 40 input frequency is higher. The fast filter tune voltage from the fast filter 201 is applied to the non-inverting input of integrator operational amplifier 220 through either diode 221 or 222 placing a higher voltage or lower voltage on the non-inverting input. The change in voltage on the non-inverting input causes the voltage to change to the same level on the inverting input to fast charge or discharge capacitor 210. The range over which the charging current to the integrator capacitor 210 can be changed is set by the gain/bandwidth of the fast filter 201 before the diodes 221 and 222. The loop bandwidth of the fast filter 201 may be greater than that of the slow filter 202 by as much as 300 times thereby further enhancing the tune time.

The amount that the charging current can be changed (increased or decreased) is limited by the output voltage range of the operational amplifiers in the circuit. The output voltage range is limited by power supply voltage V with the output voltage rising to near the power supply voltage V. In an exemplary case, the output voltage upper limit may be 9.5 volts assuming a 10 volt power supply voltage V. In this example case, applying a voltage of 9.5 volts on the non-inverting input causes the inverting input voltage rises to 9.5 volts thereby increasing the charging current to integrator capacitor 210. With a phase detector 40 output voltage of 1 volt on the integrator 250 input under normal operation through slow filter 202 and with sufficient gain in fast filter 201, the charging current is increased by (9.5+0.5)/1 or 10 times in the fast tune mode when the fast filter 201 applies the higher voltage. This increase in voltage greatly reduces the time it takes to charge the integrator capacitor 210, since the charge time is a linear function and is reduced by 10. By adding the optional resistor 217 the current that charges the integrator capacitor 210 can be scaled. This scaling changes the overall loop gain of the PLL. Changing the input voltage to the integrator 250 provides one enhancement and the optional resistor 217 adds the capability to scale the charging current into the integrator 250 with the present invention.

When the phase difference between the reference 20 signal and the divided VCO 15 signal is less than ±2π, the PFD 40 operates in a phase detect mode. The output of the PFD 40 in the phase detect mode is a switching waveform whose duty cycle is dependent on the phase difference between the reference 20 signal and divided VCO 15 signal. The fast filter 201 filters this waveform and applies the fast filter tune voltage DC level on diodes 221 and 222. As the phase locked loop tunes this DC voltage drops until either diode 221 or 222 previously forward biased turns off. When a diode turns off, the additional bias applied to the inverting input of integrator operational amplifier 220 is removed and rapid charging or discharging of the integrator capacitor 210 is terminated. The slow filter 202 now controls the synthesizer 10 with the slow filter tune voltage as the synthesizer 10 settles onto a new tune frequency and becomes phase locked. The only impact on the synthesizer from the fast filter 201 is the noise from the optional resistor 217 on the inverting input of the integrator operational amplifier 220 and the bias resistor 218 at the non-inverting input.

The frequency synthesizer 10 can be designed for optimum noise performance in the slow filter 202. The fast filter 201 can be designed for a fast tune time with a different bandwidth. If a small change in bandwidth is required the slow filter 202 can be utilized for both filters.

Figure 4:
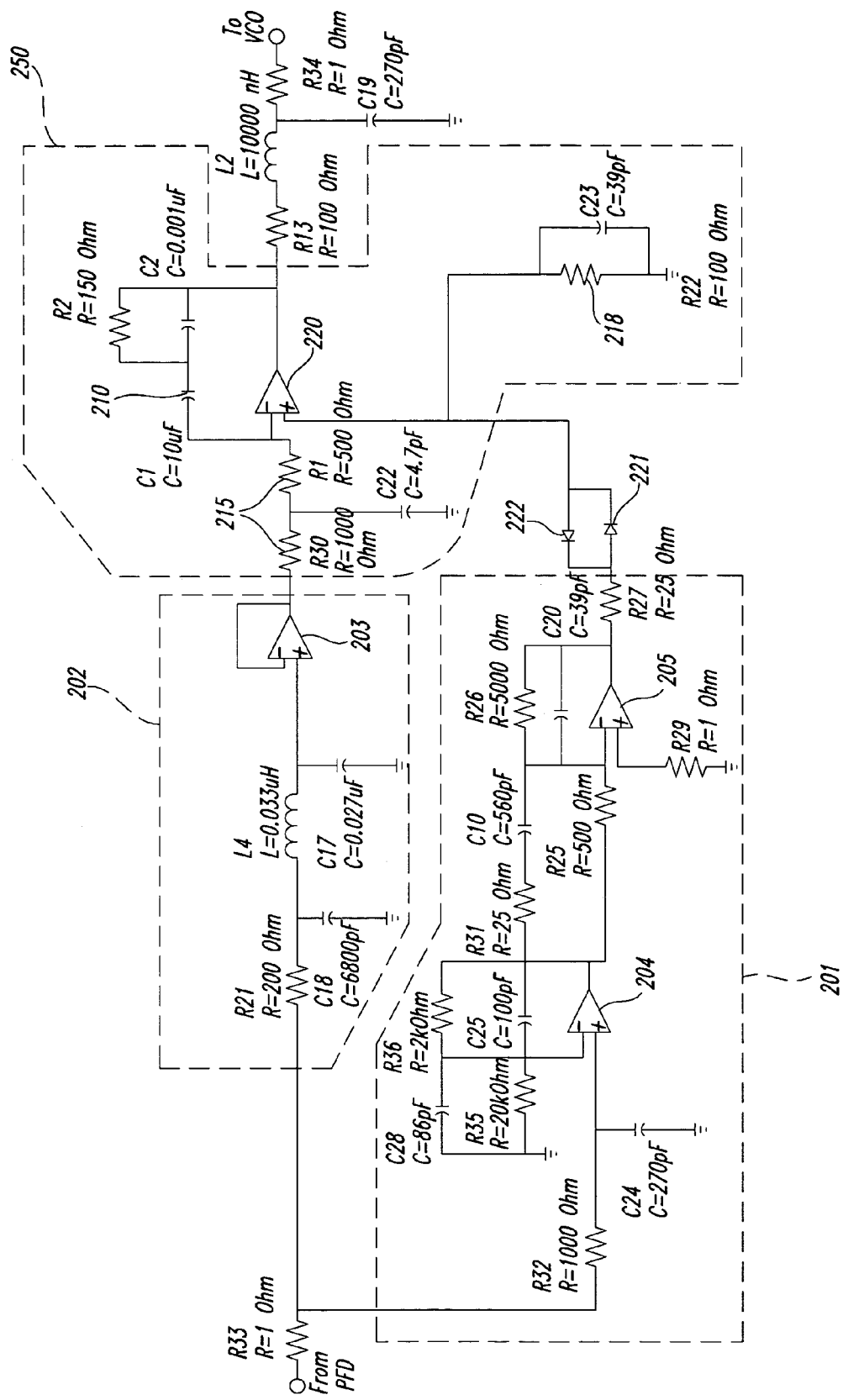
FIG. 4 is a detailed schematic of an exemplary implementation of the present invention.

FIG. 4 is a detailed schematic of an exemplary implementation of the present invention. In FIG. 4, the slow filter 202 comprises low pass filter components R21, C17, C18, and L4 and operational amplifier 203 acting as a unity gain buffer. The fast filter 201 has a much wider bandwidth with gain from two operational amplifier active filter stages 204 and 205. The integrator 250 contains the integrator capacitor 210 with a value of 10 µF in this example. Charging integrator capacitor 210 through integrator resistor 215 made up of R1 and R30 and having a total value of 1500 ohms results in a time constant (t=RC) of 15 milliseconds. The present invention significantly shortens the time to charge integrator capacitor 210 by applying a higher or lower voltage on the non-inverting input of integrator operational amplifier 220 through the fast filter 201 and thereby changing the voltage on the inverting input to charge the capacitor 210.

It is believed that the phase locked loop with low phase noise and fast tune time of the present invention and many of its attendant advantages will be understood by the foregoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A phase locked loop having fast tune time and low phase noise comprising:
    a voltage controller oscillator (VCO) for providing an output signal controlled by a tune voltage;
    a divider connected to the VCO for dividing the output signal from the VCO;
    a reference oscillator for generating a reference signal;
    a phase detector connected to the divider and the reference oscillator for comparing the reference signal to the divided VCO signal and generating a phase detector error signal indicating a lock condition of the phase locked loop;
    a fast filter having an input connected to the phase detector and having a wide bandwidth for filtering the phase detector error signal and providing a fast filter tune voltage when the phase locked loop is tuning;

a pair of diodes having one end connected to the fast filter wherein one of said pair of diodes is forward biased depending on said fast filter tune voltage;

a slow filter having an input connected to the phase detector and the fast filter and having a narrow bandwidth for filtering the phase detector error signal and for providing a slow filter tune voltage; and an integrator without any shared element with the slow filter comprising:

an op amp having an inverting input, a non-inverting input and an output wherein the non-inverting input is connected to another end of the pair of diodes;

an integrator capacitor connected to the op amp inverting input and the output; and an integrator resistor connected to the slow filter and to the op amp inverting input;

wherein the integrator capacitor is rapidly charged by the fast filter tune voltage to quickly tune the phase locked loop and wherein the slow filter tune voltage tunes the VCO when the phase locked loop is locked.

2. The phase locked loop of claim 1 wherein the fast filter tune voltage changes a bias on the non-inverting input of said integrator operational amplifier thereby changing a bias on an inverting input when said phase lock loop is tuning to rapidly change a charge on the integrator capacitor to to quickly tune the phase locked loop.

3. The phase locked loop of claim 2 wherein the fast filter tune voltage stops changing the bias on the non-inverting input of said integrator operational amplifier when said phase locked loop is locked on a new frequency.

4. The phase locked loop of claim 2 wherein the fast filter has a gain greater than the slow filter thereby enabling the fast filter tune voltage to change the bias on the non-inverting input when the phase locked loop is tuning.

5. The phase locked loop of claim 2 wherein the fast filter tune voltage rises to near an operational amplifier supply voltage when said phase locked loop is tuning.

6. The phase locked loop of claim 5 wherein the fast filter tune voltage is near the supply voltage when said phase detector output voltage is at a high maximum DC level.

7. The phase locked loop of claim 2 further comprising a resistor connected to the inverting input of said integrator operational amplifier to scale a charging current to the integrator capacitor.

8. A phase locked loop having fast tune time and low phase noise comprising a VCO operating under control of a reference oscillator and a VCO output signal divided by a divider wherein a phase frequency detector compares an output signal from said reference oscillator and the divided VCO output signal to provide an error signal said phase locked loop further comprising:

a slow filter connected to the phase frequency detector said slow filter filtering the error signal with a narrow bandwidth and providing a slow filter tune voltage;

an integrator without any shared element with the slow filter connected to the slow filter and for integrating the slow filter tune voltage and providing a tune voltage to the VCO said integrator comprising an integrator capacitor and an integrator operational amplifier;

a fast filter connected to the phase frequency detector said fast filter filtering and amplifying the error signal with a wide bandwidth and high gain and providing a fast filter tune voltage at a DC level responsive to a phase difference; and a diode connected to the fast filter output and to a non-inverting input of the integrator operational amplifier wherein said diode is forward biased when said fast filter tune voltage DC level is sufficient thereby causing an inverting input of said integrator operational amplifier to change to the same DC level and further causing said integrator capacitor to rapidly change charge.

9. The phase locked loop of claim 8 wherein fast filter has a gain greater than the slow filter thereby enabling the fast filter tune voltage to exceed the slow filter tune voltage when the phase locked loop is tuning.

10. The phase locked loop of claim 9 wherein the slow filter provides the slow filter tune voltage to tune the phase locked loop when the phase locked loop is locked.

11. The phase locked loop of claim 9 wherein the fast filter tune voltage is near the supply voltage when said phase detector output voltage is at a high maximum DC level.

12. The phase locked loop of claim 8 wherein the fast filter tune voltage rises to near an operational amplifier supply voltage when said phase locked loop is tuning.

13. The phase locked loop of claim 8 further comprising a resistor connected to the inverting input of said integrator operational amplifier for scaling a charging current to the integrator capacitor.

* * * * *